(12) United States Patent
Shen et al.

(10) Patent No.: US 11,714,206 B2
(45) Date of Patent: Aug. 1, 2023

(54) REMOVABLE BATTERY CONNECTOR ADAPTER

(71) Applicant: Varex Imaging Corporation, Salt Lake City, UT (US)

(72) Inventors: Xiaoyang Shen, Salt Lake City, UT (US); Matthew McCabe, Salt Lake City, UT (US); Marcelo Costa, Salt Lake City, UT (US)

(73) Assignee: Varex Imaging Corporation, Salt Lake City, UT (US)

( * ) Notice: Subject to any disclaimer, the term of this patent is extended or adjusted under 35 U.S.C. 154(b) by 507 days.

(21) Appl. No.: 16/730,953

(22) Filed: Dec. 30, 2019

(65) Prior Publication Data

US 2021/0157019 A1 May 27, 2021

Related U.S. Application Data

(60) Provisional application No. 62/941,335, filed on Nov. 27, 2019.

(51) Int. Cl.
*G01T 7/00* (2006.01)
*H01R 33/92* (2006.01)
(Continued)

(52) U.S. Cl.
CPC .................. *G01T 7/00* (2013.01); *G01T 1/20* (2013.01); *H01R 12/716* (2013.01);
(Continued)

(58) Field of Classification Search
CPC ........... G01T 7/00; G01T 1/20; H01R 12/716; H01R 12/727; H01R 13/40; H01R 13/5202; H01R 13/5219; H01R 13/631; H01R 13/665; H01R 13/6658; H01R 13/74; H01R 33/92; H01R 12/52; H01R 12/62; H01R 12/72; H01R 12/722; H01R 12/73; H01R 12/732; H01R 12/79; H01R 31/02;
(Continued)

(56) References Cited

U.S. PATENT DOCUMENTS 5,885,107 A * 3/1999 Sluss .................. H01R 13/4223
439/660
8,825,123 B1 * 9/2014 Gudino .................. A45C 11/00
455/575.8
(Continued)

FOREIGN PATENT DOCUMENTS

CN 1728733 A 2/2006
CN 201278131 Y 7/2009

*Primary Examiner* — Abdullah A Riyami
*Assistant Examiner* — Justin M Kratt
(74) *Attorney, Agent, or Firm* — Dorsey & Whitney LLP

(57) ABSTRACT

A detector includes an enclosure having a side wall, a sensor array positioned in an enclosed portion of the enclosure, a controller connected to the sensor array and positioned in the enclosure, with the controller being connected to a first electrical connector within the enclosure, a second electrical connector positioned external to the side wall, with the first and second electrical connectors being removably connected to each other through the side wall, and a third electrical connector in electrical communication with the second electrical connector, with the third electrical connector configured to contact a fourth electrical connector of an energy storage device.

20 Claims, 13 Drawing Sheets

(51) Int. Cl.
| | |
|---|---|
| H01R 13/631 | (2006.01) |
| H01R 13/52 | (2006.01) |
| G01T 1/20 | (2006.01) |
| H01R 12/72 | (2011.01) |
| H05K 7/14 | (2006.01) |
| H05K 5/00 | (2006.01) |
| H01R 13/74 | (2006.01) |
| H01R 13/66 | (2006.01) |
| H01R 13/40 | (2006.01) |
| H01R 12/71 | (2011.01) |
| H05K 1/14 | (2006.01) |
| H01R 12/52 | (2011.01) |
| H01R 12/73 | (2011.01) |
| H01R 12/62 | (2011.01) |
| H01R 12/79 | (2011.01) |
| H05K 3/36 | (2006.01) |
| H01R 31/02 | (2006.01) |

(52) U.S. Cl.
CPC ........... *H01R 12/727* (2013.01); *H01R 13/40* (2013.01); *H01R 13/5202* (2013.01); *H01R 13/5219* (2013.01); *H01R 13/631* (2013.01); *H01R 13/665* (2013.01); *H01R 13/6658* (2013.01); *H01R 13/74* (2013.01); *H01R 33/92* (2013.01); *H05K 1/14* (2013.01); *H05K 5/0026* (2013.01); *H05K 7/1427* (2013.01); H01R 12/52 (2013.01); H01R 12/62 (2013.01); H01R 12/72 (2013.01); H01R 12/722 (2013.01); H01R 12/73 (2013.01); H01R 12/732 (2013.01); H01R 12/79 (2013.01); H01R 31/02 (2013.01); H05K 3/36 (2013.01)

(58) Field of Classification Search
CPC ...... H05K 1/14; H05K 5/0026; H05K 7/1427; H05K 3/36
See application file for complete search history.

(56) References Cited

U.S. PATENT DOCUMENTS

| | | | |
|---|---|---|---|
| 9,647,474 B2 * | 5/2017 | Fathollahi | H02J 7/342 |
| 2012/0142221 A1 | 6/2012 | Naskali | |
| 2015/0355693 A1 * | 12/2015 | Chang | H05K 5/0086 |
| | | | 361/679.48 |
| 2020/0185871 A1 * | 6/2020 | Matsuura | H01R 43/00 |

* cited by examiner

REMOVABLE BATTERY CONNECTOR ADAPTER

RELATED APPLICATIONS

The present application claims the benefit of U.S. Provisional Patent Application No. 62/941,335 filed Nov. 27, 2019, titled "Removable Battery Connector Adapter", the disclosure of which is incorporated herein, by reference, in its entirety.

BACKGROUND

X-rays are a form of high frequency, penetrating electromagnetic radiation, with energy and absorptive properties selected for use in a variety of different medical and industrial settings. Applications include, but are not limited to, medical imaging, diagnostics, radiology, radiotherapy, radiography and tomography, non-destructive testing, materials detection and analysis, and security and inspection.

Conventional radiological diagnostic system emits electromagnetic radiation on one side of a subject, and the emissions are detected by a detector on the opposite side of the subject. The detectors can, in some cases, convert x-rays that strike its surface into light and then turn the light into electronic data that a computer can display as a high-quality digital image. The detectors can include amorphous silicon sensors, radiation-converting materials, low-noise analog and high-speed digital electronics, custom control and processing electronics, and compact packaging.

Detectors (e.g., flat panels) are used frequently (e.g., multiple times daily) and in a wide range of different environments. They are, in certain embodiments, therefore, made portable and lightweight. Some panels have batteries to make them easy to move and use without being restrained by cords and wires. After data is collected, the panel can be connected by a wired or wireless connection to another computer for data transfer and analysis. Detectors may also generally been made to fit within industry-standard dimensions, such as having a maximum thickness of approximately 15 millimeters (mm), to fit with other components of the x-ray system, such as a bucky tray.

DETAILED DESCRIPTION

Figure 1:
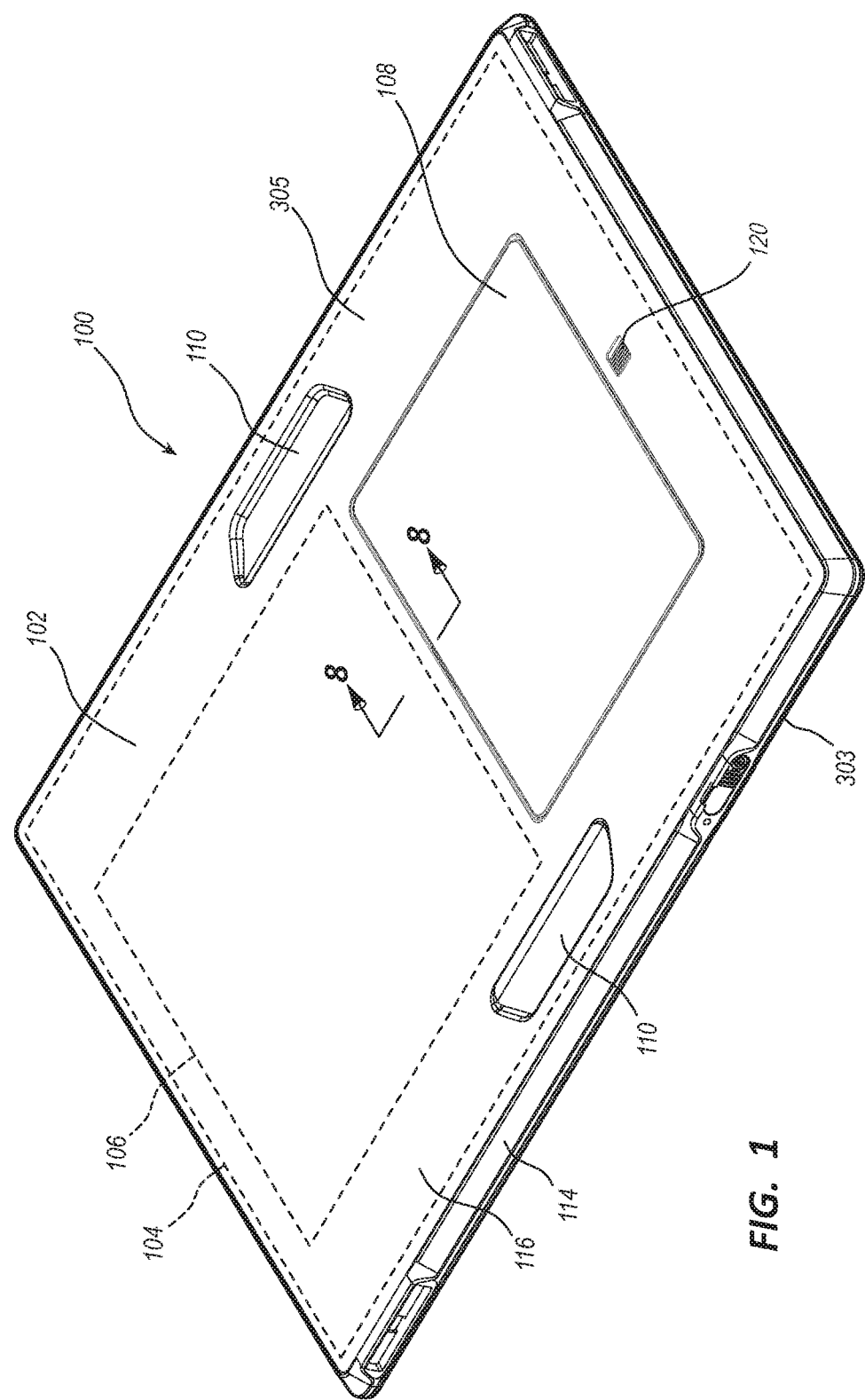
FIG. 1 is a perspective view of a detector.

Before any embodiments of the disclosure are explained in detail, it is to be understood that the embodiments of the disclosure are not limited in their application to the details of construction and the arrangement of components set forth in the following description or illustrated in the associated drawings. The embodiments are capable of other configurations and of being practiced or of being carried out in various ways. Numbers provided in flow charts and processes are provided for clarity in illustrating steps and operations and do not necessarily indicate a particular order or sequence. Unless otherwise defined, the term "or" can refer to a choice of alternatives (e.g., a disjunction operator, or an exclusive or) or a combination of the alternatives (e.g., a conjunction operator, and/or, a logical or, or a Boolean OR). Unless otherwise defined, "connected" can refer to an electrical or mechanical connection. Relative terms such as "about," "approximately," or "substantially" indicate that absolute exactness is not required and that features or elements being modified by such terms are within acceptable tolerances as would be recognized by on of ordinary skill in the art. For example, as used herein, the term "substantially perpendicular" shall be interpreted to include any orientation within five degrees of perpendicular, or from between 85 and 95 degrees.

Some embodiments relate generally to radiological imaging systems, including x-ray detectors, battery connectors, battery chargers, and related components thereof. Representative applications include, but are not limited to, imaging, medicine, diagnostics, radiology, radiotherapy, radiography and tomography, and a range of industrial x-ray technologies.

Portable, wireless detectors (e.g., flat panel detectors) are subjected to heavy use that causes their batteries to deplete quickly and need frequent recharging. Accordingly, the battery is removable and replaceable by the user. In order to facilitate swapping batteries, the batteries are electrically connected to the detector by connectors that are easily separable from each other, such as, for example, a plurality of conductor pads on the battery that are configured to come into contact with a respective plurality of resiliently deflectable conductors located on or in the detector housing. When batteries are moved and removed often, the battery terminals of the detectors go through a large number of duty cycles. Even when robust connectors are used, they eventually degrade in performance or fail.

Many conventional detectors have a circuit board (e.g., a printed circuit board (PCB)) supporting the plurality of resiliently deflectable conductors located on or in the detector housing. Thus, when the conductors degrade and fail, replacement or repair of the conductors is a technically difficult and expensive process. The enclosure of the detector may need to be opened, conductors may need to be desoldered and replaced, and in many cases the entire PCB may need replacement or repair. These types of operations are typically performed by the detector manufacturer or authorized service representatives and make user repairs unfeasible and overly complex. Simply using a more durable connector is not always possible due to tight size constraints.

In other words, the maximum thickness of the panel may be conventionally limited due to prevailing industry standards.

Accordingly, aspects of the present disclosure relate to systems and apparatuses for improving user access and repairability of electrical connectors in detectors and other devices by implementing multiple connectors linking multiple conductors in a detector. A pair of the connectors can be removably attached to each other separate from and independent of the connection between the battery and the resiliently deflectable battery connector of the panel. Therefore, if the deflectable battery connector of the panel is damaged or otherwise needs replacement or repair, the pair of connectors can be disconnected and a new deflectable battery connector can be easily added. The pair of the connectors can have a male component, called a plug, that connects to a female component, or socket. Alternatively, the pair of connectors can be hermaphroditic (genderless) connectors includes mating surfaces having simultaneous male and female aspects, involving complementary paired identical parts each containing both protrusions and indentations. The resiliently deflectable portion of the connector can be in the plug, the socket, or the hermaphroditic connector. Conventionally, the resiliently deflectable portion of the connector is movable and degrades in performance or fails before the stationary portion of the connector, but either resiliently deflectable portion or stationary portion can degrade or fail. In some embodiments, a first connector can be positioned on a circuit board within an enclosed portion of the enclosure of the detector, and the first connector can be sealed and protected against ingress of fluids, dust, and other invasive materials. A second connector can be positioned on a second circuit board can be positioned external to the enclosed portion and can be removably connectable to the first connector and to an easily accessible part of the enclosure. A third connector (e.g., a "pogo" pin connector or other biased or deflectable connector) can be connected to the second connector on the second circuit board. A "pogo" pin is a spring-loaded pin male component that can include a plunger, a barrel, and a spring. When force is applied to the pin, the spring is compressed and the plunger moves inside the barrel. When no force is applied, the shape of the barrel retains the plunger, stopping the spring from pushing the plunger completely out of the barrel. The plunger makes contact with the mating surface. The pogo pins can have improved durability over other electrical contacts with resilience of their electrical connection to mechanical shock and vibration. Other biased or deflectable connectors can include spade or blade contacts, hyperboloid contacts, or similar contacts. The plug can include spade contact with a corresponding socket to mate with and apply a resilient pressure on the spade contact. The resilient mechanism can be a leaf spring or similar type spring. Hyperboloid contacts are designed to withstand extreme physical demands, such as vibration and shock and also may require less insertion force than other connectors. In a connector with hyperboloid contacts, each female contact has several equally spaced longitudinal wires twisted into a hyperbolic shape, which wires are highly resilient to strain, but still somewhat elastic, hence the wires function as linear springs. Thus, if the third connector fails, the second circuit board can be easily removed and replaced to restore the functionality of the third connector to the detector without having to open or unseal the interior portion of the enclosure, desolder any parts, or replace large and expensive components (e.g., the main PCB) that are still in working condition. Furthermore, the multi-part connector assembly can be used within the space constraints of industry standards for detectors. In addition, the multi-part connector assembly may replace a legacy or conventional connector assembly that does not have an easily removable second circuit board to provide backward compatibility with existing legacy battery connectors and battery recesses.

FIG. 1 shows a perspective view of a detector 100 comprising an enclosure 102 for a sensor array 104. The sensor array 104 can be electrically connected to a controller 106 within the enclosure 102 that is configured to receive signals from the sensor array 104 and to transmit those signals to a computer or other connected device via a wired or wireless communications system. The sensor array 104 and controller 106 can be powered by a user-replaceable energy storage device, such as a battery 108, secured to the exterior of the enclosure 102 and in electrical communication with the controller 106.

The detector 100 shown in FIG. 1 can be a flat panel detector configured for digital radiography. Some medical applications can include mammography, fluoroscopy, computed tomography (CT), and projection radiography in fields such as medical and dental. Some non-medical and industrial applications can include CT, baggage, cargo, and container inspection, non-destructive testing, materials discrimination and analysis, and research. In some embodiments, the detector 100 can be another type of electronic device, such as another piece of medical equipment, industrial equipment, a consumer device, or other device having a user-replaceable energy storage device. In some embodiments, components of the detector 100 are implemented in a battery charger for charging batteries used in the detector 100. For example, the internal and external connector assemblies (e.g., 709, 711; see FIG. 7) can provide connection through a wall of a battery charger.

The enclosure 102 can be an enclosure or housing for a portable x-ray flat panel detector configured for digital radiographic x-ray systems with mobile components. In some embodiments, the enclosure 102 is sized and shaped to fit existing standard bucky trays for radiology equipment such as tables, chest stands, and mobile carts. In some configurations, the enclosure 102 has a maximum depth of about 15 millimeters (mm). In some embodiments, the enclosure 102 can have a maximum depth between about 12 millimeters and about 18 millimeters. In an example, the enclosure 102 has a width of about 14 inches (i.e., about 36 centimeters) and a length of about 17 inches (i.e., about 43 centimeters) along with a depth such as noted above. The enclosure 102 can include or support grip recesses (e.g., 110), ports, switches, and other user interface elements for holding and operating the detector 100. The enclosure 102 can also support lights, gauges, or other indicators that show the status of the controller 106 and the detector 100 as a whole.

In some cases, the enclosure 102 has an enclosed interior portion, cavity, or chamber (e.g., 402) that holds the sensor array 104 and controller 106. See FIGS. 4 and 8 and their related descriptions below. The enclosed portion can be sealed against ingress of various types of invasive material such as, for example, dust, debris, fluids, air, containments, and related substances. The enclosure 102 can also comprise a battery connection portion (e.g., a battery recess 112 or battery retainer portion; see FIG. 3) configured to support and retain the battery 108 in place on the detector 100.

Figure 3:
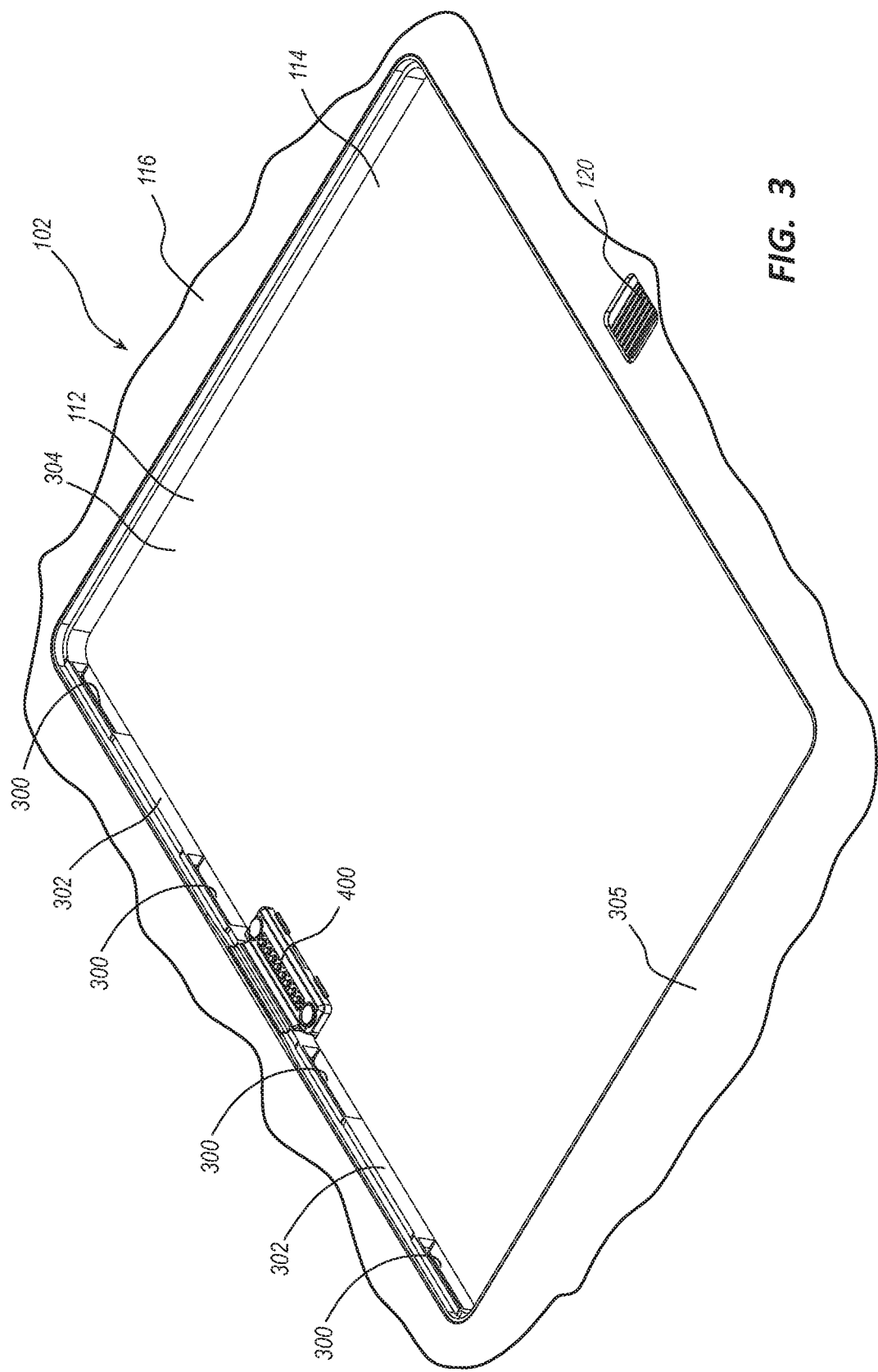
FIG. 3 is a perspective view of a battery recess in the detector of FIG. 1.

In some embodiments, the enclosure 102 can include a front housing portion 114 and a rear housing portion 116. As illustrated in FIGS. 1 and 3, the front housing portion 114 can include the front side of the detector, side walls along the perimeter of the detector, and the battery recess and side walls forming a cavity for the enclosure to house the sensor array 104 and the controller 106, and the rear housing portion 116 can be a planar structure with an opening for the batter recess on the backside of the detector to enclose the cavity within the enclosure. The front and rear housing portions 114, 116 can be attached to each other to define the enclosed interior portion or cavity within the enclosure 102. The front and rear housing portions 114, 116 can therefore be resistant to penetration by invasive materials or external impacts to protect the components within the enclosure 102. The interface between the front and rear housing portions 114, 116 can include a seal or gasket (e.g., 404) configured to prevent intrusion of invasive material between the front and rear housing portions 114, 116. See FIGS. 4 and 8.

The sensor array 104 can be a flat panel detector configured to convert x-rays or other electromagnetic radiation, in conjunction with the controller 106, into electronic data that a computer can read. In some embodiments, the data can be displayed as a high-quality digital image. The sensor array 104 includes at least a two dimensional array of sensor pixels configured to generate image data. When used for x-ray imaging, the sensor array can use a direct conversion sensor array that converts x-ray photon directly of each pixel into an electrical signal or the sensor array can use a scintillator to convert x-ray photon into light photons (e.g., visible light photons) with an indirect conversion sensor array that converts light photons of each pixel into an electrical signal. In some embodiments, the sensor array 104 and controller 106 can comprise an amorphous silicon sensor panel having radiation-converting materials, low-noise, analog or high-speed digital electronics, custom control and processing electronics, and exhibit a relatively compact size.

The battery 108 can be an portable energy storage device or portable power source configured to provide electrical energy to the controller 106. In an example, the battery can convert chemical energy into electrical energy on discharge and convert electrical energy into chemical energy on charge. For example, the battery 108 can be a lithium-ion battery, an alkaline battery, a nickel-cadmium battery, a fuel cell, super capacitor, or similar device for storing and providing energy. The battery 108 can be non-destructively removed from the enclosure 102 to quickly switch the battery 108 with another battery when its charge is depleted. As used herein, unless otherwise noted, a battery refers more generally to a user-replaceable energy storage device.

Figure 2:
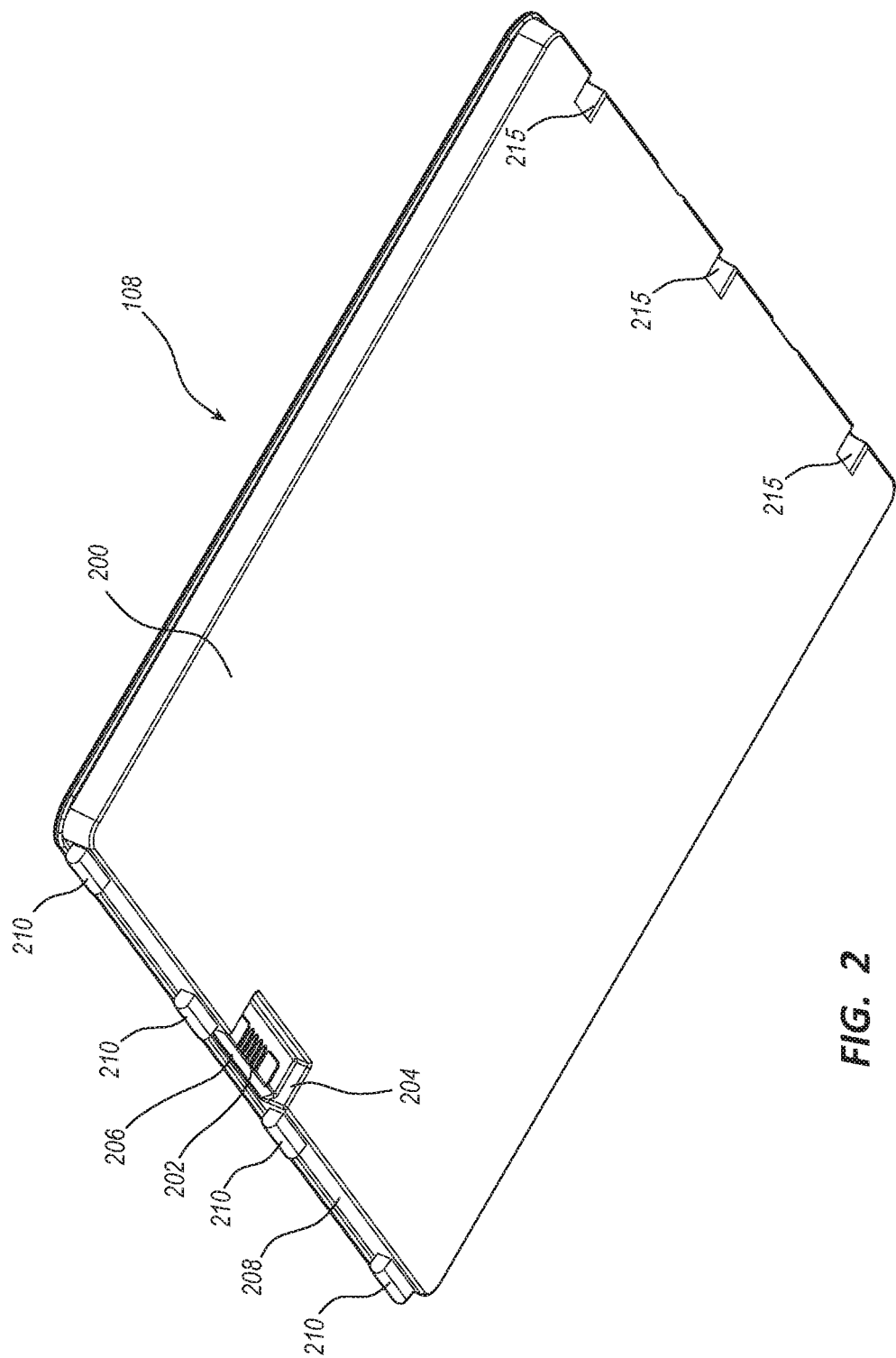
FIG. 2 is a perspective view of a battery used in a detector.

FIG. 2 shows a perspective view of an inner (or under) side 200 of the battery 108 that is configured to face the enclosure 102 when it is mounted to the enclosure 102. As shown in FIG. 2, the battery 108 can have a set of conductive contacts 202 for electrically connecting to the controller 106 via a connector assembly extending through the enclosure 102. See also FIG. 8. The conductive contacts 202 can be positioned in a recess 204 in the battery 108 and can face in an inward direction (i.e., the contacts 202 can be parallel to the plane defined by the major width and length dimensions of the enclosure 102 and can face toward the inner base surface 506; see FIG. 8). Thus, the contacts 202 can be positioned on a reduced-thickness portion 206 of the battery 108 relative to an increased-thickness portion 208 that is adjacent to the recess 204. The battery 108 can also include a plurality of protrusions 210 configured to be inserted into recesses (e.g., 300; see FIG. 3) of the enclosure 102 to retain the battery 108 in a desired position relative to the enclosure 102 and to ensure that the contacts 202 remain in electrical contact with contacts that link the battery 108 to the controller 106. The protrusions 210 can extend laterally from the battery 108 and can be positioned on increased-thickness portions 208 of the battery 108. The protrusions 210 can be positioned on sidewalls of the battery 108 to interact with recesses in sidewalls of the battery recess 112 in the enclosure 102. Additionally or alternatively, the battery can include a plurality of recesses configured to be inserted into protrusions of the enclosure to retain the battery. For example, the recesses 215 defined by the battery 108 can correspond to mating protrusions in the enclosure for precise placement and securement of the battery. In some embodiments, the battery 108 can be retained by hooks, interlocking parts, or other attachment methods known in the art, such as the battery release mechanism 120, shown in FIGS. 1 and 3.

FIG. 3 shows a perspective view of the battery recess 112 in the enclosure 102 in which the battery 108 can be positioned. The battery recess 112 can comprise openings 300 (e.g., grooves, sub-recesses, or holes) in the sidewall 302 or inner wall 304 of the battery recess 112, and the openings 300 can be configured to receive the protrusions 210 of the battery 108. The battery recess 112 can be a reduced-depth or reduced-thickness portion of the enclosure 102, wherein the thickness between the front/top surface 303 (which is opposite the rear housing portion 116; see FIG. 1) of the enclosure 102 and the inner wall 304 of the battery recess 112 can be less than the thickness or depth between the front/top surface 303 of the enclosure 102 and the rear/bottom surface 305 of the enclosure 102. According to some embodiments, the thickness at the inner wall 304 can be less than about 12 millimeters. In some cases, the depth of the battery recess 112 (at inner wall 304) relative to the rear housing portion 116 can be substantially equal to the thickness of the battery 108. In some cases, the battery 108 can have a thickness of between 3 and 10 mm, between 5 and 8 mm, or approximately 6.5 mm.

Figure 4:
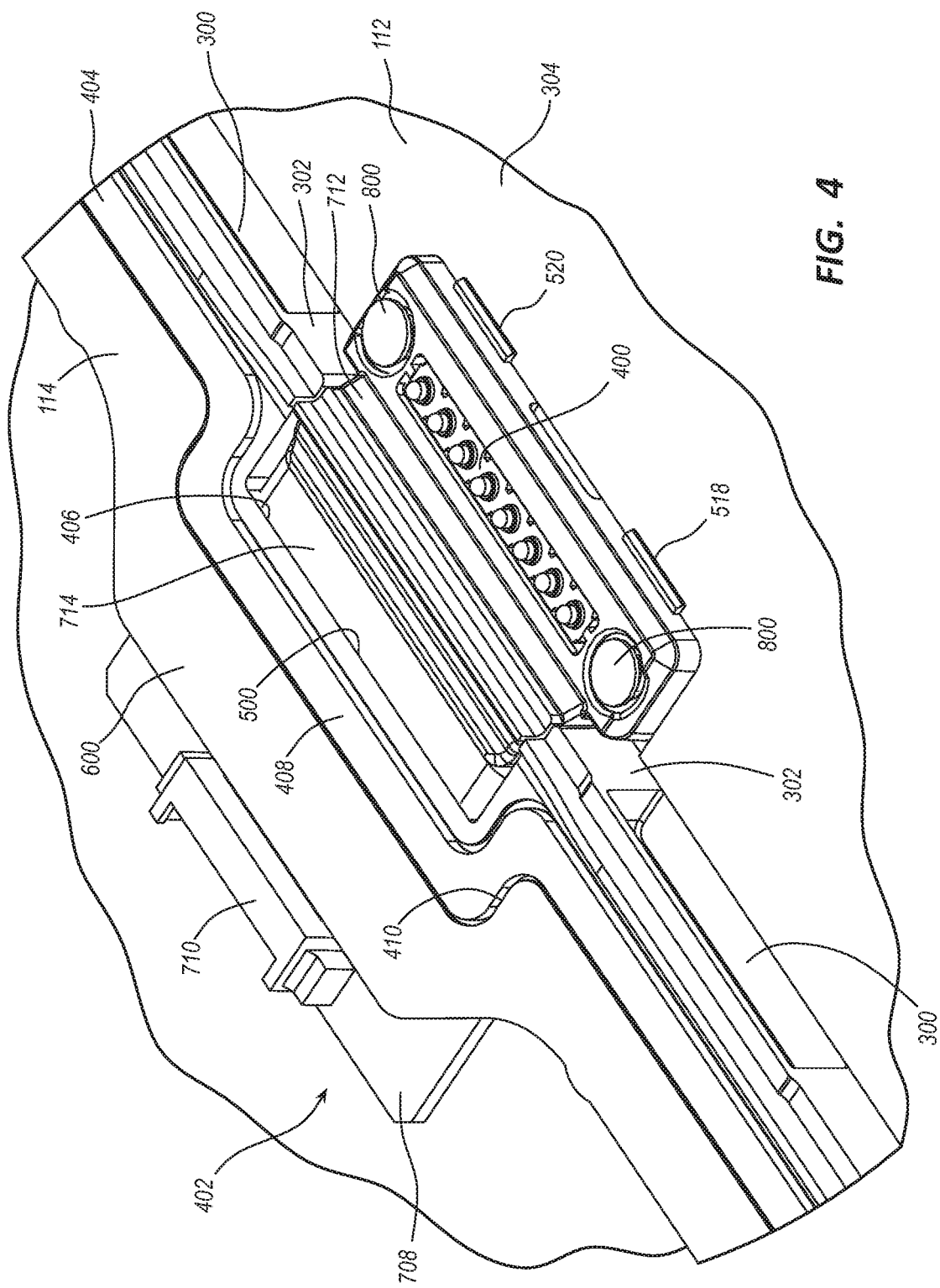
FIG. 4 is a perspective view of a connector at the battery recess of FIG. 2 with a rear housing portion of the detector being omitted.

The battery recess 112 can have a battery connector 400 exposed within it. FIG. 4 shows a detailed view of an end of the battery recess 112 where the battery connector 400 is positioned. As explained in further detail elsewhere herein, the battery connector 400 can be configured to contact and provide electrical connection to the conductive contacts 202 of the battery 108. The battery connector 400 can be configured to be positioned within the recess 204 of the battery 108 when the battery 108 is installed in the detector 100.

In FIG. 4, the rear housing portion 116 of the enclosure 102 has been removed to show a section of the enclosed portion 402 within the enclosure 102. Accordingly, the gasket 404 between the front and rear housing portions 114, 116 is visible as well. The gasket 404 can comprise a rubber or other resilient material configured to be compressed between the housing portions 114, 116 and to thereby prevent ingress of materials between the housing portions. In some embodiments, the gasket 404 can be replaced or supplemented by an adhesive material, foam material, or another type of sealing device. In some cases, the front and rear housing portions 114, 116 are formed as a single unitary housing, thereby eliminating the need for a gasket 404 at their interface.

The omission of the rear housing portion 116 in FIG. 4 also shows that a connector recess 406 can be formed in the sidewall 302 of the battery recess 112. See also FIG. 5. The connector recess 406 is covered by the rear housing portion 116 in FIG. 3. The gasket 404 and groove 410 can have a staggered or deflected portion 408 that wraps around and seals the housing portions 114, 116 around the connector recess 406 in the manner shown in FIG. 4.

Figure 5:
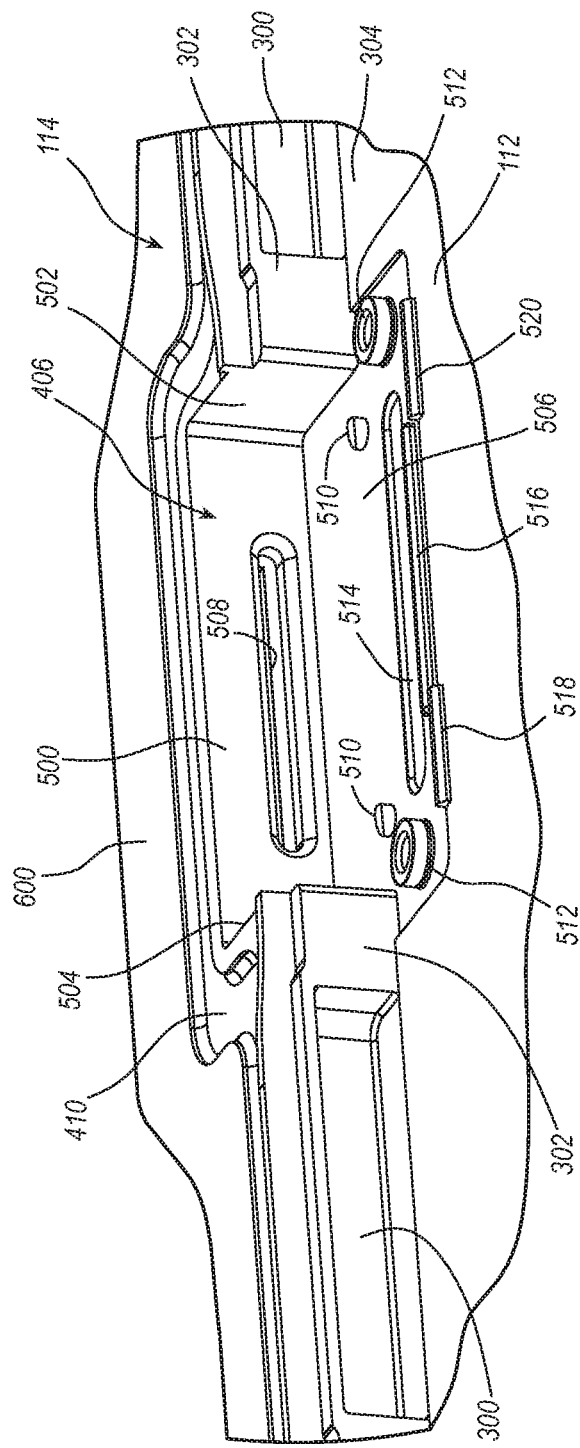
FIG. 5 is a perspective view of a connector recess of the battery recess of FIG. 2.

FIG. 5 shows a perspective view of the connector recess 406 as seen from within the battery recess 112 and with the front housing portion 114 isolated from other parts of the detector 100. The connector recess 406 can include an inner sidewall 500 adjoined by two opposing lateral sidewalls 502, 504 that connect to the sidewall 302 of the battery recess 112. The connector recess 406 can therefore have a generally u-shaped sidewall perimeter for sidewalls 502, 500, and 504. An inner base surface 506 can adjoin all three of the sidewalls 500, 502, 504 in the connector recess 406. The inner base surface 506 can comprise various features, including retaining protrusions 510, fastener openings 512, a solder recess 514, or retainer ridges 516, 518, 520 as explained in further detail below. The inner sidewall 500 can also comprise a connector opening 508 that opens the battery recess 112 (at connector recess 406) to the enclosed portion 402.

Figure 6:
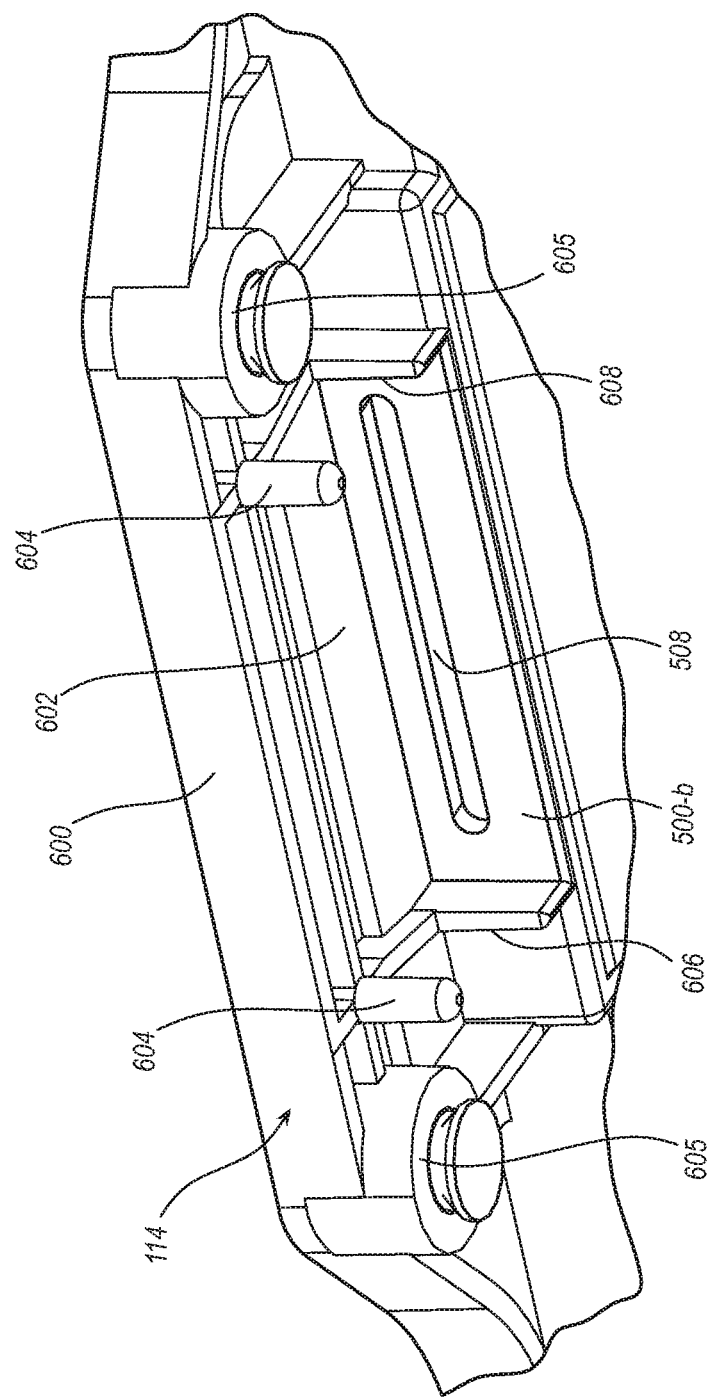
FIG. 6 is a perspective view of an opposite side of the inner side wall of the battery recess of FIG. 5.

FIG. 6 shows a perspective view of the enclosed side 500-b of the inner sidewall 500 from a position within the enclosed portion 402. In other words, this view shows the enclosed side 500-b of the inner sidewall 500 and connector opening 508 as seen from within the enclosed portion 402. As indicated in FIGS. 5 and 6, the front housing portion 114 can include a shelf 600 at the staggered or deflected portion 408 of the groove 410, i.e., at a position that corresponds with and extends from the connector recess 406. The shelf 600 can have a top-facing portion 602 having a set of retaining protrusions 604 and fastener openings 605. (Note that the top of the detector 100 is positioned at the bottom of FIG. 6 and faces downward in FIG. 1.) The enclosed side 500-b of the inner sidewall 500 can be positioned next to retainer ridges 606, 608 within the enclosed portion 402.

Figure 7:
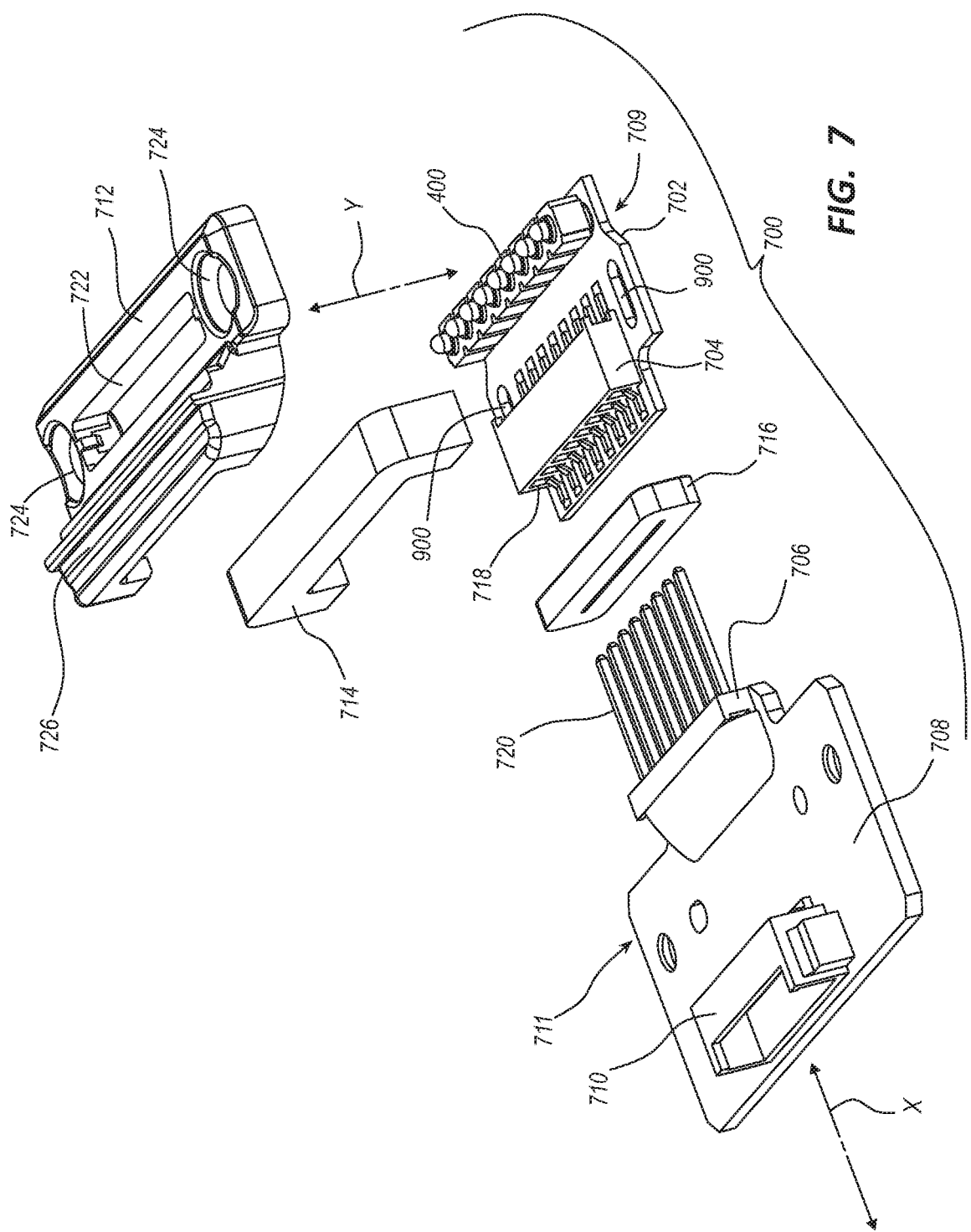
FIG. 7 is an exploded view of a connector and sealing assembly of the detector of FIG. 1.

FIG. 7 shows an exploded view of a connector and sealing assembly 700 that is positionable on the enclosed and battery-recess-exposed sides of the connector recess 406. In other words, the connector and sealing assembly 700 can provide and seal an electrical connection through the connector opening 508 to provide electrical communication between the controller 106 and the battery 108. The battery connector 400 can be positioned at the exposed end of the connector and sealing assembly 700. The battery connector 400 can be attached to an external circuit board 702 having an external intermediate connector 704. The external intermediate connector 704 can be configured to make electrical connection to an internal intermediate connector 706 attached to an internal circuit board 708 that has a controller connector 710. The external circuit board 702, battery connector 400, and external intermediate connector 704 can be referred to as an external connector assembly 709. The internal circuit board 708, internal intermediate connector 706, and controller connector 710 can be referred to as an internal connector assembly 711. The external and internal intermediate connectors 704, 706 can be referred to as a board-to-board connector or connection. The battery connector 400 can be referred to as a battery terminal interface connector or a deflectable contact connector.

FIG. 7 also shows a main cover 712 and secondary cover 714 configured to partially cover and retain the external connector assembly 709 to the battery recess 112 within the connector recess 406. A seal 716 can be positioned between the external and internal connector assemblies 709, 711, such as at the inner sidewall 500 (or the enclosed side 500-b thereof) and at or near the connector opening 508. The main cover 712, secondary cover 714, and seal 716 are described in further detail below.

Figure 8:
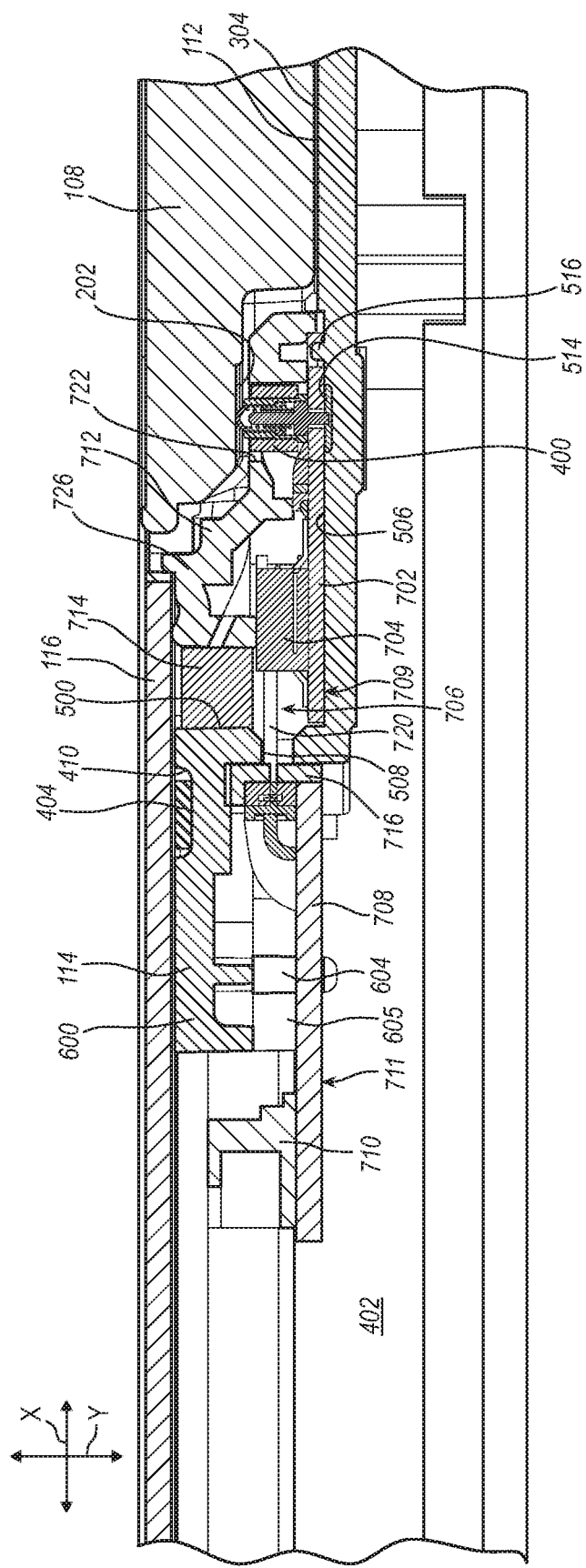
FIG. 8 is a side section view as taken through section lines 8-8 in FIG. 1.

FIG. 8 shows a side section view of the detector 100 taken through section lines 8-8 in FIG. 1. This figure shows the parts of FIGS. 2-7 in an assembled condition that illustrates their interaction. Thus, as shown in FIG. 8, the front and rear housing portions 114, 116 are assembled with the gasket 404 in the groove 410. The internal connector assembly 711 is at least partially retained within the enclosed portion 402 of the enclosure 102 by the retaining protrusions 604, retaining ridges 606, 608 (see FIG. 6), and fasteners in the fastener openings 605 extending from the shelf 600 on each side of the internal circuit board 708.

The controller connector 710 can be connected to the controller 106. The internal intermediate connector 706 can extend through the opening 508 to engage and contact the external intermediate connector 704. The seal 716 can be on the enclosed side of the opening 508 (i.e., contacting the enclosed side 500-b) and can wrap around the internal intermediate connector 706 while being simultaneously pressed against the enclosed side 500-b of the inner sidewall 500.

The external circuit board 702 can be positioned at the inner base surface 506 and can be held in place by the main cover 712 and secondary cover 714. At least the main cover 712 can be affixed to the battery recess 112 at the fastener openings 512 shown in FIG. 5, as indicated by fasteners 800 in FIG. 4. O-rings or another seal (not shown) can be provided at the fastener openings 512 (e.g., between the fastener openings 512 and the fasteners 800) to limit or prevent ingress ability of fluids that may wick between the fasteners 800 and their openings 512. As shown in FIG. 8, the battery 108 can have its set of conductive contacts 202 facing toward and contacting the battery connector 400. Accordingly, electrical communication can be established from the battery 108 to the controller 106 via the internal and external connector assemblies 709, 711 which are connected to each other across the inner sidewall 500.

FIG. 8 also indicates how the external and internal connector assemblies 709, 711 provide a change in direction of the orientation of the electrical connection established through the inner sidewall 500. The controller connector 710 and controller 106 can connect at the internal connector assembly 711 in a generally horizontal direction (i.e., parallel to axis X in FIG. 8). The internal connector assembly 711 can connect to the external connector assembly 709 in a direction parallel to that direction (i.e., also parallel to axis X) through the inner sidewall 500 at the internal and external intermediate connectors 706, 704. The battery connector 400 can provide electrical connection to the battery 108 in a generally vertical direction (i.e., parallel to axis Y in FIG. 8). Accordingly, the orientation of the connectors can change by about 90 degrees at different points in the connector and sealing assembly 700. By changing the connection plane from a horizontal direction to a vertical direction (or vice versa), the external and internal connector assemblies 709, 711 minimize the thickness of the external and internal connector assemblies 709, 711 within the enclosure 102, and they are able to fit within the tight thickness constraints of a typical enclosure 102 (e.g., one having a very low overall thickness, i.e., less than 15 millimeters between the front housing portion 114 and the rear housing portion 116). In some embodiments, the external and internal connector assemblies 709, 711 are configured to fit within dimensions defined by ISO specification 4090 (383.5+/−1×459.5+/−1× 15+1.00−2.00 millimeters). In some embodiments, bigger, more durable connectors (e.g., a more robust battery connector 400) might possibly reduce the need for removable electronics (e.g., external connector assembly 709), but the bigger connectors typically do not fit in the small spaces available within a detector.

The battery connector 400 can comprise a plurality of pins or other electrically conductive deflectable members configured to come into contact with the conductive contacts 202 of the battery 108. The battery 108 is removable from the enclosure 102, so its position relative to the enclosure 102, even when mounted to the enclosure 102, can vary somewhat due to tolerances, user fit error, predetermined clearance space, different battery contact wear levels, etc. Due to variation in the space between the conductive contacts 202 and the battery connector 400, the battery 108 (or replacement batteries) may not always be secured at the exact same position relative to the battery connector 400 each time the battery 108 is installed in the battery recess 112. Accordingly, the battery connector 400 can comprise deflectable, flexible, compressible, or movable contacts to compensate for the variation in the positioning of the battery 108 by resiliently extending from the external circuit board 702. In an example embodiment, the battery connector 400 can comprise pins that are biased away from the external circuit board 702 and toward the conductive contacts 202 of the battery 108. When the battery 108 is installed, the conductive contacts 202 can apply pressure to the pins of the battery connector 400, and the biasing force against the pins can be overcome by pressure applied by the user as the battery 108 is put into place. However, the biasing force may remain in force to ensure that the pins of the connector 400 remain in firm electrical contact with the conductive contacts 202 while the battery 108 is installed. In some embodiments, the battery connector 400 can comprise "pogo" pins that are biased away from the external circuit board 702 by springs. In some cases, the battery connector 400 can include resiliently bendable conductors, spring-like wires, leaf springs, other resiliently deflectable structures, or combinations thereof to provide electrical communication between the conductive contacts 202 and the external circuit board 702 for a range of different distances between the external circuit board 702 and the battery 108. In some embodiments, the role of the pins of the battery connector 400 is reversed with the role of the conductive contacts 202, wherein the battery 108 comprises deflectable or otherwise movable conductors and the connector 400 comprises stationary contacts.

The moving or resilient portions of the battery connector 400 can be a common source of failure in conventional detectors, and those moving or resilient portions are commonly attached to a controller and extend through the enclosure of the controller to contact the battery. Over extended use, the moving or resilient portions wear out or are damaged, corroded, or otherwise rendered inoperative. Replacement of the entire controller, including major disassembly of the enclosure, may be required to repair and restore operation of the battery connector.

Embodiments of the present disclosure can address such issues by having the battery connector 400 positioned on an easily removable and inexpensive external circuit board 702 that connects to the controller 106 and other internal components of the detector 100. If the battery connector 400 fails or is damaged, a user or technician can quickly, easily, and inexpensively remove the main cover 712 to replace the external circuit board 702 with one that has a fully-functional battery connector 400. Additionally, the external circuit board 702 can be replaced by a different circuit board (such as one having a different type or configuration of battery connector 400) to provide modularly customizable control over the power connector of the detector. For example, a different circuit board 702 can be used in place of the one shown in FIG. 7 to enable the detector 100 to be adapted for use with a different type or size of battery 108 or battery connector.

The internal intermediate connector 706 and external intermediate connector 704 can have a pin and socket or slot interconnection. The external intermediate connector 704 can comprise a plurality of pin receptacles 718 (see FIG. 7) configured to receive a respective plurality of pins 720 of the internal intermediate connector 706. See also FIG. 11. The internal and external intermediate connectors 704, 706 can therefore be mating connectors or board-to-board connectors configured to provide multiple electrical connections through the opening 508 of the inner sidewall 500. The size and shape of the internal and external intermediate connectors 704, 706 can correspond to the size and shape of the opening 508 in a manner that minimizes extra space located between the connectors 704, 706 and the inner edge perimeter of the opening 508. The internal and external intermediate connectors 704, 706 can be releasably connectable to each other, wherein a user can non-destructively and reversibly opt to remove the external connector from the internal connector and reconnect the connectors to each other afterward. In some embodiments, the connectors 704, 706 can be separated and reconnected without tools. The opening 508 can therefore be slightly larger than the pins 720. In some configurations, at least five operational pins are used, wherein two pins can be used to provide a power connection, one pin can be used for a signal connection, and two pins can be used for error connections. Additional pins (e.g., 3 more pins) can be included for redundancy of the power, signal, and error connections or for other purposes.

The internal intermediate connector 706 is shown having pins 720 extending into the connector recess 406. In some embodiments, the internal intermediate connector 706 can comprise a potted reinforcement to help prevent the internal intermediate connector 706 from being dislodged from the internal circuit board 708 or broken. In some embodiments, the pins 720 can be located on the external intermediate connector 704 and the receptacles 718 can be located on the internal intermediate connector 706. However, the pins 720 can beneficially be positioned on the internal intermediate connector 706 in order to make it easier to attach the external connector assembly 709 to the pins 720 and to help preserve the seal at seal 716. The seal 716 can wrap closely around the pins 720 (or can be flowed around the pins in the case of, for example, a grease or resin seal 716) to prevent leakage of fluids or other invasive material between the seal 716 and the pins 720 into the enclosed portion 402 at the opening 508.

In an example, the internal circuit board 708 can include at least a portion of the controller 106 functionality. In another example, the internal circuit board 708 can be a separate circuit board that electrically couples a separate controller circuit board to the external circuit board 702.

When the internal circuit board 708 is coupled to a separate controller circuit board with at least a portion of the controller 106 functionality, the controller connector 710 can be another electrical connector positioned on the internal circuit board 708 in the enclosed portion 402. A corresponding cable connector can be configured to electrically connect to the separate controller circuit board or a corresponding controller circuit board connector can mate with the controller connector 710 to provide electrically connectivity between the controller 106 and the external circuit board 702. The controller connector 710 can electrically connect the controller 106 to the internal circuit board 708. In some embodiments, the controller connector 710 comprises the same number of electrical terminals as the number of pins 720 and pin receptacles 718. In some embodiments, the controller connector 710 can be omitted, such as when the internal circuit board 708 is part of a circuit board of the controller 106 itself.

The external circuit board 702 can be a printed circuit board or similar substrate configured to electrically connect and support the external intermediate connector 704 and the battery connector 400. Similarly, the internal circuit board 708 can be a substrate providing electrical connection and support between the internal intermediate connector 706 and the controller connector 710. In some embodiments, the circuit boards 702, 708 comprise glass fiber reinforced resin material with conductive material linking the connectors 704/400 and 706/710 to each other. In some embodiments, the external and internal circuit board 702, 708 can have a waterproof coating such as a coating of conformal material to protect the board from damage by coming into contact with debris or fluids. The external circuit board 702 can have a surface facing the inner base surface 506 with solder joints that extend into the solder recess 514. The solder recess 514 can therefore be aligned with those solder joints to receive the solder joints within the recess 514 (see FIG. 8), thereby limiting pressure against the solder joints when the main cover 712 is attached in the position shown in FIG. 4.

The external connector assembly 709 can be non-destructively removed from the detector 100 and replaced by a second external connector assembly 709 without having to open or otherwise unseal the gasket 404 or seal 716. Accordingly, the enclosure 102 can have ingress protection characteristics for the enclosed portion 402 that are unaffected by removal or replacement of the external connector assembly 709 since the external connector assembly 709 is positioned entirely external to the gasket 404 and the seal 716.

The main cover 712 can comprise a rigid, durable material configured to protect and retain the external connector assembly 709. For example, the main cover 712 can comprise a rigid plastic, carbon fiber, or metal material. As shown in FIG. 7, the main cover 712 can have a connector opening 722 and a set of fastener openings 724. The battery connector 400 can extend through the connector opening 722, as shown in FIGS. 4 and 8, to contact the battery 108. A set of fasteners 800 (e.g., screws or bolts) can secure the main cover 712 to the fastener openings 512 at the inner base surface 506. See FIG. 4. The main cover 712 can also comprise a wall portion 726 configured to cover the top of the external connector assembly 709 across the connector recess 406 by itself or in conjunction with the secondary cover 714. See FIGS. 4 and 8. Accordingly, the main cover 712 can prevent the external connector assembly 709 from being contacted by large objects in the battery recess 112 (e.g., debris) or from falling out of the connector recess. The main cover 712 can contact the rear housing portion 116 at the wall portion 726, as shown in FIG. 8. The main cover 712 can also be sized to fit within the recess 204 in the battery 108.

The external connector assembly 709 can be movable relative to the main cover 712 while the main cover 712 is attached to the enclosure 102. For example, the external connector assembly 709 can be connected to the internal intermediate connector 706 at a plurality of different inserted positions that cause the external connector assembly 709 to be positioned at one or more of a plurality of different lateral positions across the inner base surface 506 (i.e., along axis X in FIG. 8). The mobility of the external connector assembly 709 relative to the main cover 712 can reduce or eliminate pressure on the external circuit board 702 and can thereby enable the external connector assembly 709 to have a longer service life. Additionally, removal of the main cover 712 can enable the external connector assembly 709 to be conveniently and quickly removed because there may be no fasteners or adhesives holding the external connector assembly 709 in place. The external connector assembly 709 can also beneficially be retained by the main cover 712 instead of by its own fasteners due to the outer shape of the external circuit board 702 being generally less defined than the positioning of screw holes in an injection-molded housing. The main cover 712 can be retained in place by the fasteners 800 and by contact with the outer retainer ridges 518, 520 in the inner wall 304 of the battery recess 112.

Figure 9:
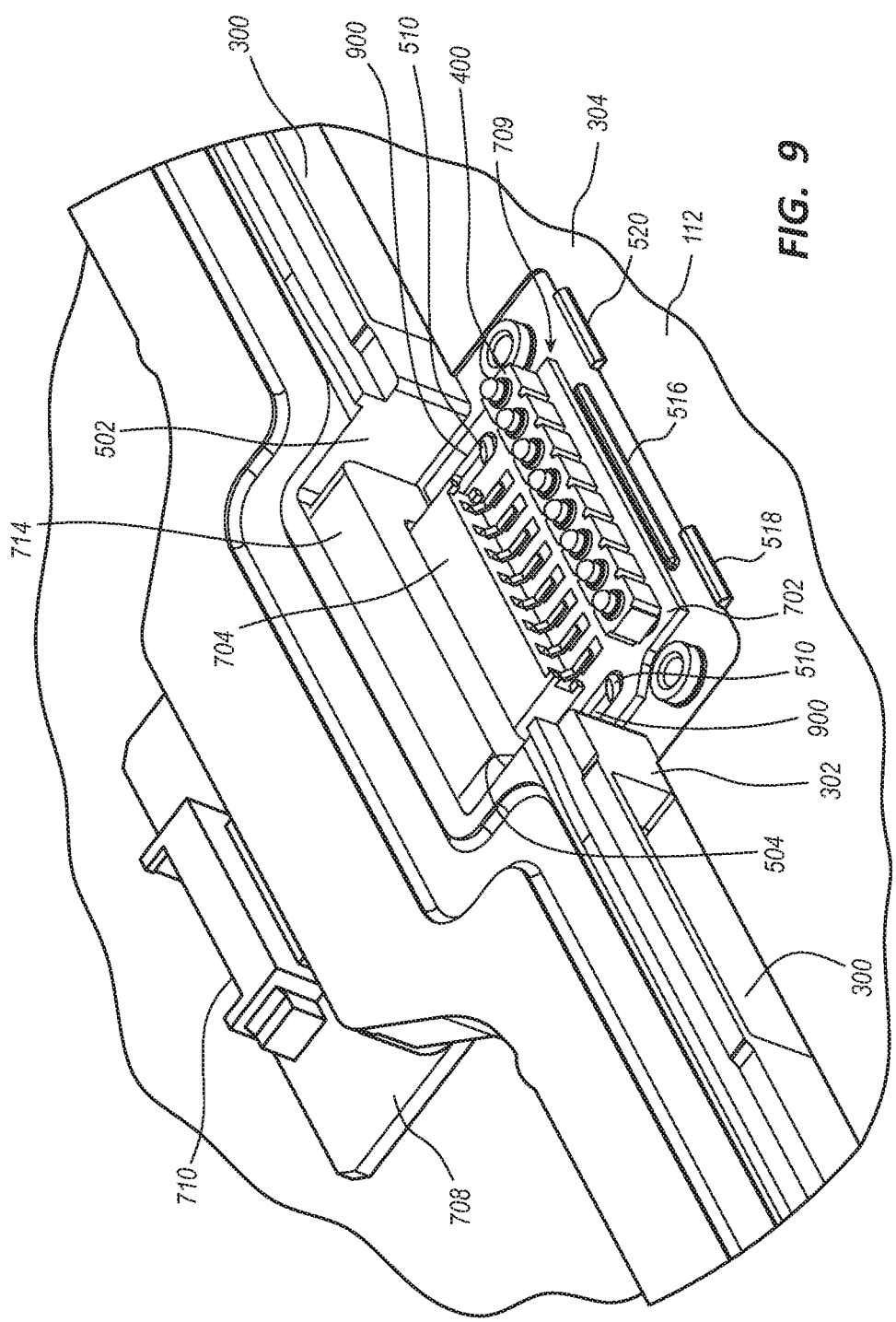
FIG. 9 is a perspective view of the connector with a main cover omitted.

The secondary cover 714 can be positioned within the connector recess 406 above the external connector assembly 709, as shown in FIGS. 8 and 9. The secondary cover 714 can be referred to as a dust cover or seal that blocks debris and other invasive material from passing into contact with the intermediate connector 704/706 after penetrating between the rear housing portion 116 and the main cover 712. The secondary cover 714 can comprise a foam or other resilient material configured to expand to fill empty space between the external connector assembly 709 and the rear housing portion 116, as shown in FIG. 8. The secondary cover 714 can be a friction fit or retained by the main cover 712. The secondary cover 714 can therefore prevent accumulation of fluids or debris on top of the external connector assembly 709 to limit corrosion. In some embodiments, the secondary cover 714 is omitted.

The seal 716 can comprise a resilient sealing material configured to conform to the shape of the enclosed side 500-b of the inner sidewall 500 and the shape of the plurality of pins 720. For example, the seal 716 can comprise a rubber or resilient polymer material. In some embodiments, the seal 716 comprises a gasket, a closed-cell foam, an O-ring, an amount of glue, resin, or grease, another sealant material, or combinations thereof. A foam or rubber seal 716 can have an adhesive attached to it, and the adhesive can attach the foam or rubber to the sidewall 500. The seal 716 can provide ingress protection at the opening 508 such as a seal against fluid ingress, dust or other particulate ingress, debris ingress, and ingress of similar materials into the enclosed portion 402. In one case, the seal 716 can have an ingress protection rating of IP68 and can comprise AQUAPRO™ extra soft PORON™ foam with high compression (>50%) to ensure sealing contact with the enclosed side 500-b of the inner sidewall 500.

In some embodiments, the seal 716 comprises a single central opening and a general elongated o-shape. In some cases, the seal 716 can have a plurality of openings (e.g., one opening for each pin 720) that can each seal a separate part of the internal or external connector assemblies 709, 711. The seal 716 can remain in place while the external connector assembly 709 is disconnected from the internal connector assembly 711 so that the enclosed portion 402 thereby remains sealed throughout the repair or replacement process.

FIGS. 4 and 9-12 illustrate how the external connector assembly 709 can be removed from the detector 100 without opening, exposing, or unsealing the enclosed portion 402 of the enclosure 102. FIG. 4 shows the detector 100 with the battery 108 and rear housing portion 116 removed. However, the rear housing portion 116 does not need to be removed in order to access or remove the external connector assembly 709. Accordingly, the rear housing portion 116 is omitted in FIGS. 4 and 9-12 to improve visibility of the parts within the connector recess 406.

As shown in FIG. 4, the main cover 712 and its fasteners 800 are exposed and accessible in the battery recess 112 when the battery 108 is removed. Removing the fasteners 800 can enable the main cover 712 to come free from the battery recess 112 by moving away from the inner base surface 506 and over the retainer ridges 518, 520.

FIG. 9 shows another perspective view of the connector area of the enclosure 102 with the main cover 712 removed. The external connector assembly 709 is therefore exposed and capable of removal from the detector 100. The external connector assembly 709 is, however, partially retained at the inner base surface 506 by the retainer ridge 516 (which prevents significant lateral movement directly away from the inner sidewall 500), as also shown in FIG. 8. The external circuit board 702 can also include a set of slots 900 within which the retaining protrusions 510 are positioned. Contact between the retaining protrusions 510 and their respective slots 900 can limit lateral movement of the external circuit board 702 toward or away from the lateral sidewalls 502, 504. The contact between the retaining protrusions 510 and an end of their respective slots 900 can also limit movement of the external circuit board 702 toward or away from the inner sidewall 500.

With the main cover 712 removed, the secondary cover 714 can be accessed within the connector recess 406. The secondary cover 714 can be held within the connector recess 406 at least partially by the main cover 712, so the removal of the main cover 712 can permit removal of the secondary cover 714 as well.

Figure 10:
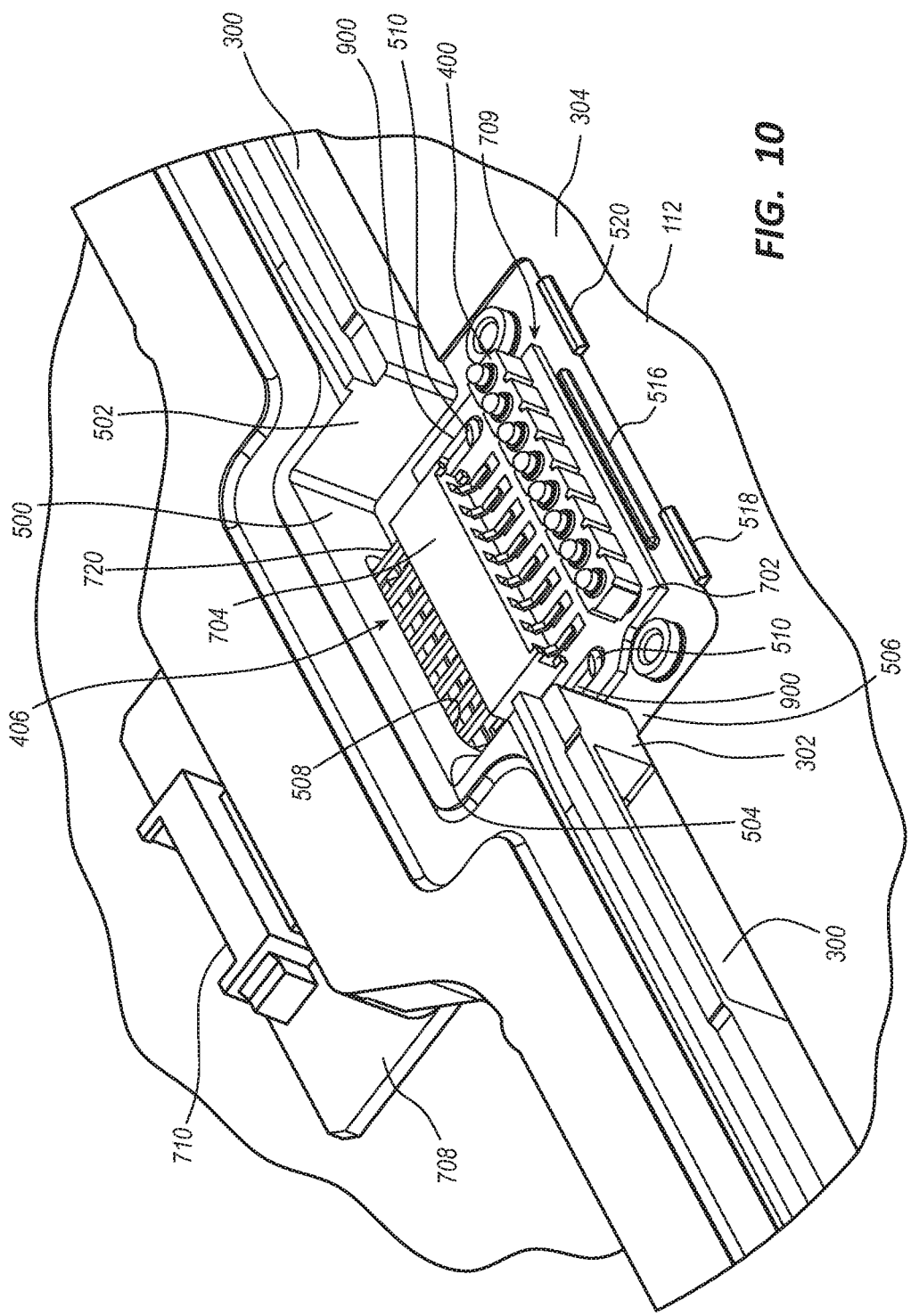
FIG. 10 is a perspective view of the connector with the main cover and a secondary cover omitted.

FIG. 10 shows the view of the connector section of the enclosure 102 with the main cover 712 and secondary cover 714 removed. The opening 508 in the inner sidewall 500 and the rest of the external connector assembly 709 is therefore exposed and accessible. From this position, the external connector assembly 709 can be removed from the connector recess 406 by applying a force withdrawing the external intermediate connector 704 from the internal intermediate connector 706 (e.g., from the pins 720).

Figure 11:
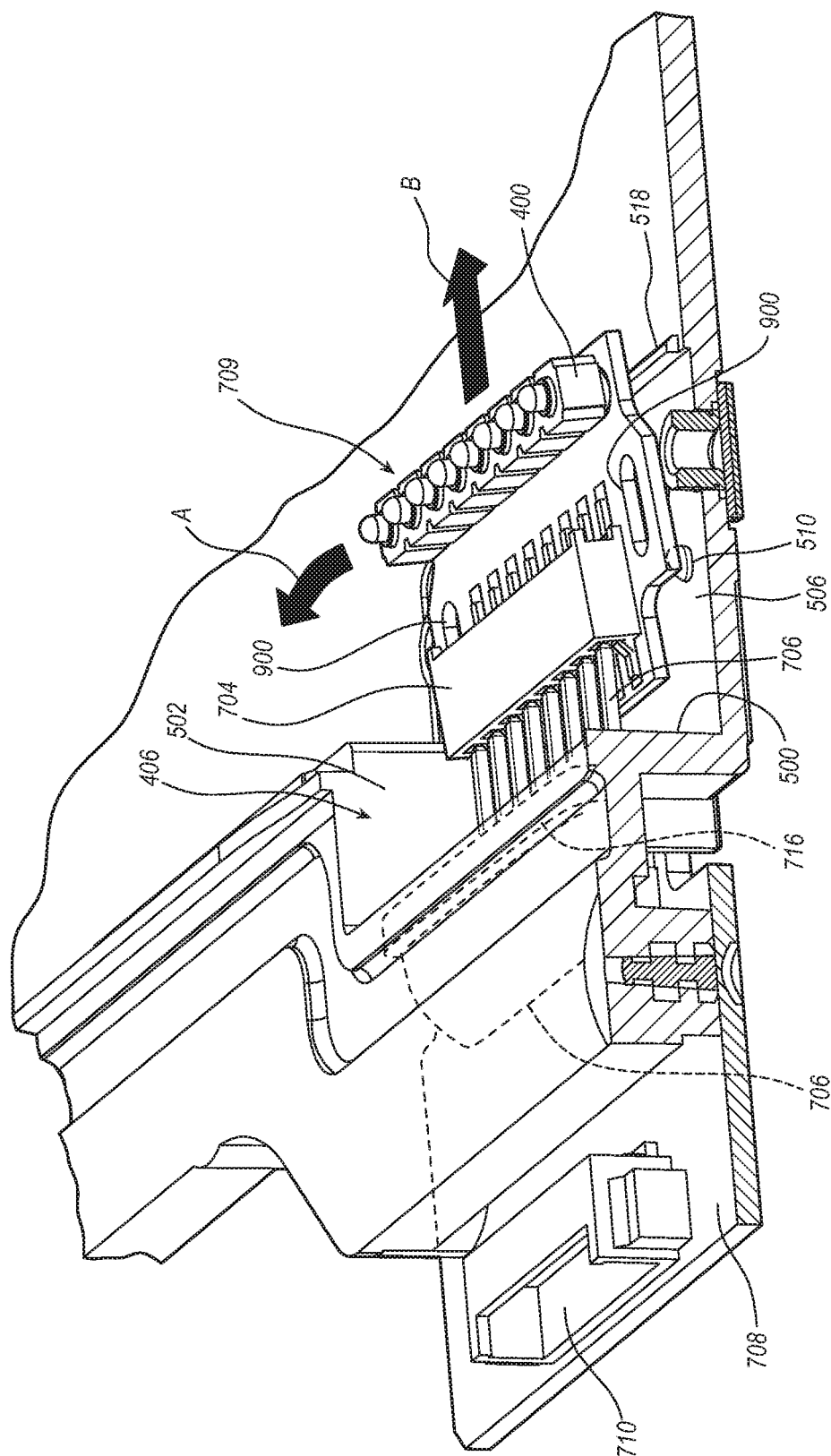
FIG. 11 is a sectional perspective view of the connector with the main cover and secondary cover omitted while the external connector assembly is being removed from the internal connector assembly.

FIG. 11 shows a partial section perspective view of the connectors as the external connector assembly 709 is removed from the internal connector assembly 711. Because the retainer ridge 516 prevents a direct lateral withdrawal (i.e., parallel to the plane defined by the inner base surface 506), the withdrawal force may be applied at a partially upward angle. As indicated by direction arrow A in FIG. 11, the external connector assembly 709 may be rotated away from the inner base surface 506 at the battery connector 400 as it is withdrawn along the direction of direction arrow B. Movement along the direction arrows A and B can cause the retaining protrusions 510 to slide within the slots 900 until the external circuit board 702 is sufficiently lifted away from the inner base surface 506, and the external circuit board 702 passes over the retaining protrusions 510 and away from the connector recess 406. In some embodiments, the retaining protrusions 510 can comprise sloped top surfaces 1100 (see FIG. 12) to provide additional clearance over the retaining protrusions 510 for the external circuit board 702 to be moved into and out of position at the connector recess 406 (i.e., the position wherein the protrusions 510 are in the slots 900). In some embodiments, the external circuit board 702 is prevented from rotating upward (i.e., along direction arrow A) until it has been laterally withdrawn (i.e., along direction arrow B) sufficiently for the internal intermediate connector 706 to be rotated relative to the external intermediate connector 704. For example, pins 720 of the internal intermediate connector 706 can be withdrawn to the ends of the openings of the receptacles 718 of the external intermediate connector 704 so that the pins 720 are not bent or otherwise damaged if the external intermediate connector 704 of the external connector assembly 709 is rotated along direction arrow A.

Figure 12:
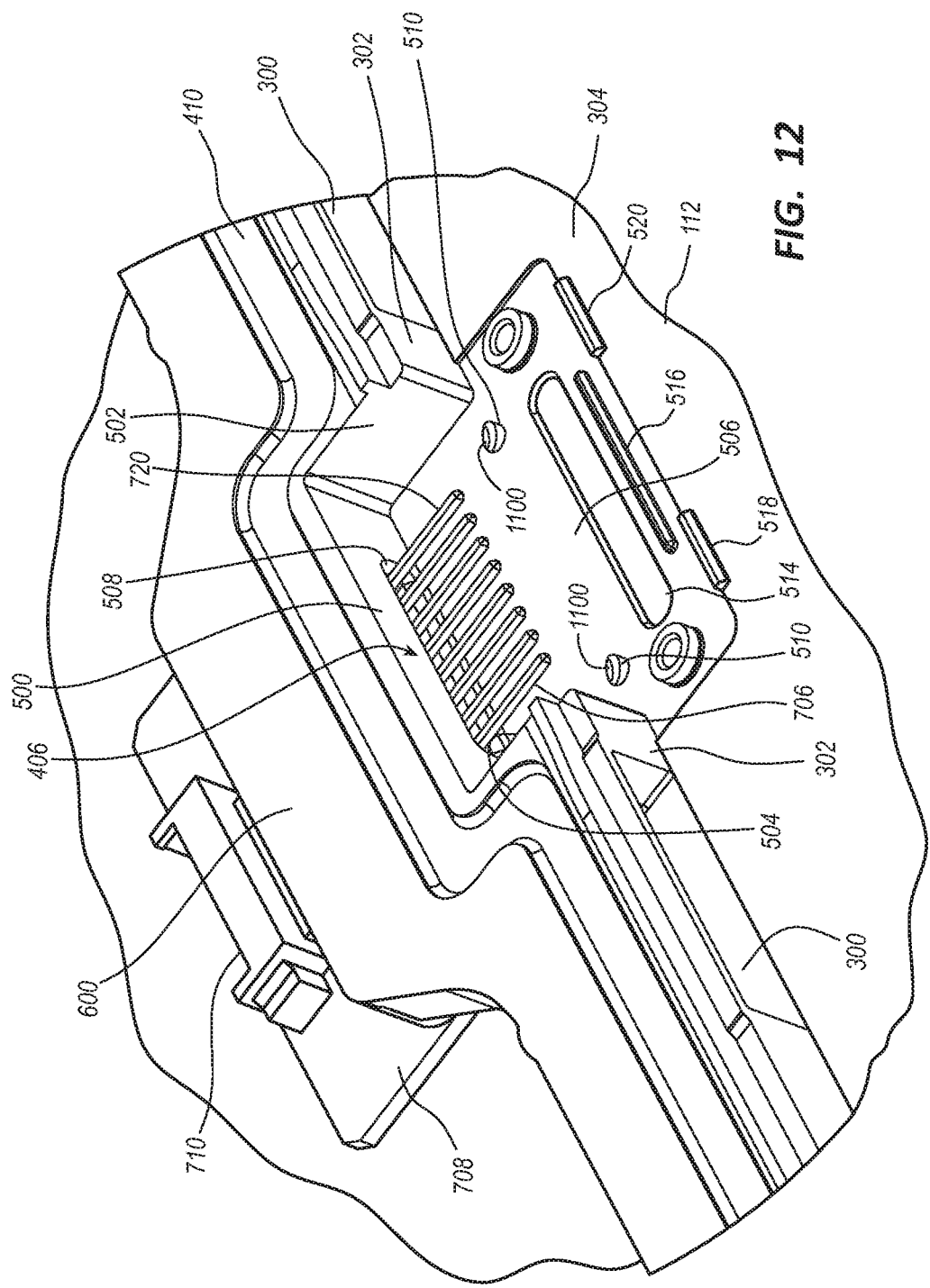
FIG. 12 is a perspective view of the connector with the main cover, secondary cover, and external connector assembly omitted.

FIG. 12 shows a perspective view of the connector recess 406 with the external connector assembly 709, main cover 712, and secondary cover 714 removed. With these components removed, the internal connector assembly 711 has the pins 720 of the internal intermediate connector 706 exposed and accessible. Accordingly, a new or different external connector assembly 709 can be installed into the position shown in FIG. 11 and then into the position of FIG. 10. A secondary cover 714 can then be inserted into the position shown in FIG. 9, and a main cover 712 can be attached into the position shown in FIG. 4. Throughout these configurations, the enclosed portion 402 can remain enclosed, sealed, and protected from ingress by invasive substances while the external connector assembly 709 is non-destructively, reversibly, and quickly replaced.

In accordance with one embodiment of the disclosure, an detector 100 is provided. The detector comprises an enclosure 102 having a sidewall 500, a sensor array 104 positioned in an enclosed portion 402 of the enclosure 102, a controller (e.g., 106 or 708) electrically connected to the sensor array 104 and positioned in the enclosure 102, with the controller being connected to a first electrical connector 706 within the enclosure 102, a second electrical connector 704 positioned external to the sidewall 500, with the first and second electrical connectors 706, 704 being removably connected to each other through the sidewall 500, and a third electrical connector 400 in electrical communication with the second electrical connector 704. The third electrical connector 400 is configured to contact a fourth electrical connector (e.g., 202) of an energy storage device (e.g., battery 108).

In one embodiment, the detector 100 further comprises a seal 716 positioned at the sidewall 500 where the first and second electrical connectors 706, 704 connect to each other, the sensor array 104 comprises a radiographic imaging sensor, the controller comprises a wireless transmitter to transmit a signal based on signals received from the radiographic imaging sensor, and the third electrical connector 400 comprises a plurality of deflectable conductors (e.g., biased pins).

In one embodiment, the enclosure 102 has an energy storage device retention portion (e.g., battery recess 112), and the first electrical connector 706 extends through the sidewall 500 at the energy storage device retention portion.

In one embodiment, the detector 100 further comprises a seal 716 positioned at the sidewall 500 at the first electrical connector 706. Alternatively, the detector 100 further comprises a seal 716 positioned at the sidewall 500 between the first electrical connector 706 and the second electrical connector 704.

In one embodiment, the detector 100 further comprises a retainer (e.g., main cover 712) removably attached to the enclosure 102 to retain the second and third electrical connectors 704, 400 to the enclosure 102.

In one embodiment, the second and third electrical connectors 704, 400 are positioned on a single circuit board 702.

In one embodiment, the controller comprises a controller circuit board (e.g., part of controller 106) and an internal circuit board (e.g., 708) electrically connected to each other (e.g., via controller connector 710) and each positioned in the enclosure 102, wherein the first electrical connector 706 is positioned on the internal circuit board 708.

In one embodiment, the third electrical connector 400 comprises a conductor configured to deflect when contacting the fourth electrical connector (e.g., conductive contacts 202) or the fourth electrical connector comprises a conductor configured to deflect when contacting the third electrical connector 400.

In one embodiment, the enclosure 102 has an overall depth dimension of approximately 15 millimeters or less.

In one embodiment, the first and second electrical connectors 706, 704 engage each other along a first axis (e.g., axis X) and the third and fourth electrical connectors (e.g., 400, 202) are configured to engage each other along a second axis (e.g., axis Y), the first axis being substantially perpendicular to the second axis.

Another aspect of the disclosure relates to an electronic device (e.g., detector 100 or a battery charger) comprising a housing (e.g., enclosure 102) having an inner area (e.g., enclosed portion 402), an outer area (e.g., battery recess 112), and a wall (e.g., inner sidewall 500) dividing the inner area from the outer area. The device also includes a first circuit board (e.g., 708) positioned within the inner area, the first circuit board having a first electrical connector (e.g., 706). A second circuit board 702 is positioned in the outer area, with the second circuit board 702 having a second electrical connector 704 removably connected to the first electrical connector 706 through the wall 500 and with the second circuit board 702 having a third electrical connector 400. A retainer (e.g., 712) is attached to the housing and retains the second circuit board 702 to the housing.

In one embodiment, the third electrical connector 400 is a deflectable connector (e.g., a biased pin connector).

In one embodiment, the retainer is removably attached to the housing.

In one embodiment, the device further comprises a seal 716, wherein the wall 500 comprises an opening 508 through which the first and second electrical connectors 706, 704 are connected and wherein the seal 716 seals the opening 508.

In one embodiment, the first circuit board 708 is removably attached to the housing.

In one embodiment, the second circuit board 702 is movable relative to the housing while being retained by the retainer.

Another aspect of the disclosure relates to an portable detector (e.g., including sensor array 104 and controller 106) comprising means for enclosing (e.g., enclosure 102, front housing portion 114, and rear housing portion 116) at least a portion of a first electronic component means (e.g., internal connector assembly 711, internal circuit board 708, internal intermediate connector 706, and pins 720) within an external surface (e.g., inner sidewall 500, enclosure 102, front housing portion 114, and rear housing portion 116), means for connecting (e.g., connectors 704 and 706, pins 720, and pin receptacles 718) the first electronic component means to a second electronic component means (e.g., external connector assembly 709, external circuit board 702, external intermediate connector 704, and pin receptacles 718) positioned external to the external surface, and means for connecting (e.g., connector 400, external connector assembly 709, and external circuit board 702) the second electronic component means to a portable power source (e.g., battery 108, fuel cell, and super capacitor) positioned external to the external surface.

In one embodiment, the portable power source comprises a battery 108.

In one embodiment, the device further comprises means for sealing an internal cavity (e.g., seal 716) of the means for enclosing the first electronic component.

In one embodiment, the means for enclosing the first portable detector includes a housing, and wherein the portable detector further comprises means for removably retaining the second electronic component to the housing (e.g., main cover 712).

Figure 13:
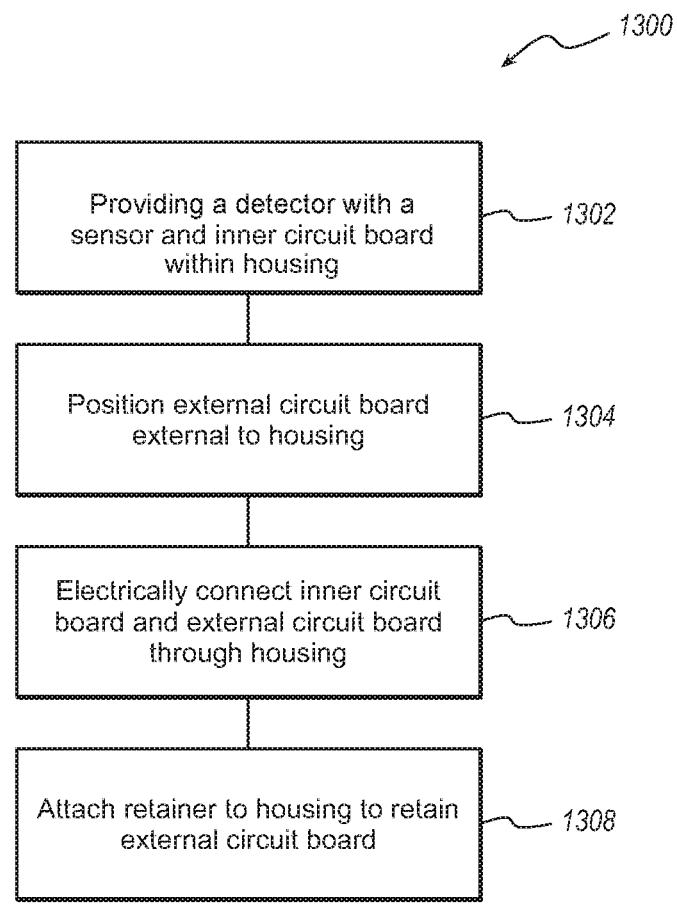
FIG. 13 is a flowchart illustrating a method for assembling a connector to a detector.

As shown in FIG. 13, yet another aspect of the disclosure relates to a method 1300 for assembling a connector to a detector (e.g., detector 100). The method can comprise providing the detector with a sensor (e.g., sensor array 104) and an inner circuit board (e.g., 708) within a detector housing (e.g., enclosure 102), and with the inner circuit board having a first electrical connector (e.g., 706) and with the detector housing having a wall (e.g., 500). See block 1302. The method can also include positioning an external circuit board (e.g., 702) external to the detector housing, with the external circuit board having a second electrical connector (e.g., 704) and a third electrical connector (e.g., 400), wherein the first electrical connector electrically connects to the second electrical connector through the wall, and wherein the second and third electrical connectors are configured to electrically connect an energy storage device (e.g., battery 108) to the inner circuit board. See blocks 1304 and 1306. In an example, the first electrical connector includes pins (e.g., 720) that extend through an opening (e.g., 508) in the wall and connects through the wall to pin receptacles (e.g., 718) of the second electrical connector. Alternatively, the second electrical connector includes pins that extend through the opening in the wall and connects through the wall to pin receptacles of the first electrical connector. The method can also include attaching a retainer (e.g., 712) to the housing, wherein the retainer retains the external circuit board to the housing. See block 1308.

In another embodiment, the method can include disassembling the connector from the detector. The method can comprise removing the retainer from the housing. The method can also include disconnecting the second electrical connector from the first electrical connector, and removing the external circuit board from the housing. The method illustrated in FIG. 13 can then be used for replacing the connector with a second similar connector that can be assembled to the detector.

In some embodiments, the method can further include sealing an opening in the wall by positioning a seal (e.g., 716) between the first electrical connector and the second electrical connector.

In some embodiments, the method can further include positioning a cover (e.g., 714) between the retainer and the external circuit board.

In some embodiments, the method can further include electrically connecting the energy storage device to the third electrical connector.

In some embodiments, the method can further include deflecting the third electrical connector upon electrically connecting the energy storage device to the third electrical connector.

In some embodiments, the method can further include disconnecting the first and second electrical connectors without breaking a seal (e.g., 716) at the wall.

In some embodiments, the method can further include disconnecting the first and second electrical connectors by rotating the external circuit board relative to the inner circuit board while withdrawing the external circuit board relative to the inner circuit board.

While these systems and methods have been described with reference to exemplary embodiments, it will be understood by those skilled in the art that various changes may be made and equivalents can be substituted to adapt these teachings to other problems, materials, and technologies, without departing from the scope of the claims. Features, aspects, components or acts of one embodiment may be combined with features, aspects, components, or acts of other embodiments described herein. The disclosure is thus not limited to the particular examples that are disclosed, but encompasses all embodiments falling within the appended claims.

What is claimed is:

1. A detector, comprising:
an enclosure having a side wall;
a sensor array positioned in an enclosed portion of the enclosure;
a controller connected to the sensor array and positioned in the enclosure;
a first electrical connector within the enclosure connected to the controller;
a second electrical connector positioned external to the side wall, the first and second electrical connectors being removably connected to each other through the side wall;
a third electrical connector in electrical communication with the second electrical connector, the third electrical connector configured to contact a fourth electrical connector of an energy storage device.

2. The detector of claim 1, wherein the controller comprises a wireless transmitter to transmit a signal based on signals received from the sensor array.

3. The detector of claim 1, wherein the enclosure has an energy storage device retention portion, and the first electrical connector extends through the side wall at the energy storage device retention portion.

4. The detector of claim 1, further comprising a seal positioned at the side wall between the first electrical connector and the second electrical connector.

5. The detector of claim 1, further comprising a retainer removably attached to the enclosure to retain the second and third electrical connectors to the enclosure.

6. The detector of claim 1, wherein the second and third electrical connectors are positioned on a single circuit board.

7. The detector of claim 1, wherein the controller comprises a controller circuit board and an internal circuit board electrically connected to each other and each positioned in the enclosure, wherein the first electrical connector is positioned on the internal circuit board.

8. The detector of claim 1, wherein the third electrical connector comprises a conductor configured to deflect when contacting the fourth electrical connector or the fourth electrical connector comprises a conductor configured to deflect when contacting the third electrical connector.

9. The detector of claim 1, wherein the enclosure has an overall depth dimension of approximately 15 millimeters or less.

10. The detector of claim 1, wherein the first and second electrical connectors engage each other along a first axis and the third and fourth electrical connectors are configured to engage each other along a second axis, the first axis being substantially perpendicular to the second axis.

11. A portable electronic device, comprising:
a housing having an inner area, an outer area, and a wall dividing the inner area from the outer area;
a first circuit board positioned within the inner area, the first circuit board having a first electrical connector;
a second circuit board positioned in the outer area, the second circuit board having a second electrical connector removably connected to the first electrical connector through the wall, the second circuit board having a third electrical connector; and
a retainer attached to the housing and retaining the second circuit board to the housing.

12. The portable electronic device of claim 11, wherein the third electrical connector comprises a deflectable portion.

13. The portable electronic device of claim 11, wherein the retainer is removably attached to the housing.

14. The portable electronic device of claim 11, further comprising a seal, wherein the wall comprises an opening through which the first and second electrical connectors are connected, wherein the seal seals the opening.

15. The portable electronic device of claim 11, wherein the first circuit board is removably attached to the housing.

16. The portable electronic device of claim 11, wherein the second circuit board is movable relative to the housing while being retained by the retainer.

17. A portable detector, comprising:
means for enclosing at least a portion of a first electronic component means within a set of external surfaces;
means for connecting the first electronic component means to a second electronic component means positioned external to the set of external surfaces;
means for removably retaining the second electronic component means to the set of external surfaces;
means for connecting the second electronic component means to a portable power source positioned external to the set of external surfaces;
means for releasably mating the portable power source to the means for enclosing.

18. The portable detector of claim 17, wherein the portable power source comprises a battery.

19. The portable detector of claim 17, further comprising means for sealing an internal cavity of the means for enclosing the first electronic component means.

20. The portable detector of claim 17, further comprising fastener means for retaining the second electronic component to the set of external surfaces.

* * * * *